(12) United States Patent
Rueger

(10) Patent No.: US 7,402,526 B2
(45) Date of Patent: Jul. 22, 2008

(54) PLASMA PROCESSING, DEPOSITION, AND ALD METHODS

(75) Inventor: Neal R. Rueger, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/492,613

(22) Filed: Jul. 24, 2006

(65) Prior Publication Data

US 2006/0264012 A1 Nov. 23, 2006

Related U.S. Application Data

(63) Continuation of application No. 10/930,895, filed on Aug. 30, 2004, now Pat. No. 7,323,400.

(51) Int. Cl.
*H01L 21/26* (2006.01)

(52) U.S. Cl. ............... 438/706; 438/513; 118/723 MW

(58) Field of Classification Search ........................ None
See application file for complete search history.

(56) References Cited

U.S. PATENT DOCUMENTS

| | | | |
|---|---|---|---|
| 5,637,966 | A | 6/1997 | Umstadter et al. |
| 5,902,649 | A | 5/1999 | Karner et al. |
| 6,220,202 | B1 | 4/2001 | Foster et al. |
| 6,355,573 | B1 | 3/2002 | Okumura et al. |
| 6,523,493 | B1 | 2/2003 | Brcka |
| 6,528,430 | B2 | 3/2003 | Kwan et al. |
| 6,713,873 | B1 | 3/2004 | O'Loughlin et al. |
| 6,829,056 | B1 | 12/2004 | Barnes et al. |
| 6,835,414 | B2 * | 12/2004 | Ramm ..................... 427/248.1 |
| 6,858,112 | B2 | 2/2005 | Flamm et al. |
| 6,936,144 | B2 * | 8/2005 | Weiler et al. ........... 204/298.06 |
| 6,960,537 | B2 | 11/2005 | Shero et al. |
| 7,015,413 | B2 | 3/2006 | Petrin et al. |

(Continued)

OTHER PUBLICATIONS

Ina T. Martin, "Comparison of Pulsed and Downstream Deposition of Fluorocarbon Materials from $C_3F_8$ and $c$-$C_4F_8$ Plasmas", Journal of Vacuum Science & Technology A: Vacuum, Surfaces, and Films, Jan. 14, 2004, vol. 22, Issue 2, pp. 227-235.

(Continued)

*Primary Examiner*—Nadine Norton
*Assistant Examiner*—Patricia George
(74) *Attorney, Agent, or Firm*—Wells St. John P.S.

(57) ABSTRACT

A plasma processing method includes providing a substrate in a processing chamber, the substrate having a surface, and generating a plasma in the processing chamber. The plasma provides at least two regions that exhibit different plasma densities. The method includes exposing at least some of the surface to both of the at least two regions. Exposing the surface to both of the at least two regions may include rotating the plasma and may cyclically expose the surface to the plasma density differences. Exposing to both of the at least two regions may modify a composition and/or structure of the surface. The plasma may include a plasmoid characterized by a steady state plasma wave providing multiple plasma density lobes uniformly distributed about an axis of symmetry and providing plasma between the lobes exhibiting lower plasma densities. Depositing the layer can include ALD and exposure may remove an ALD precursor ligand.

19 Claims, 1 Drawing Sheet

U.S. PATENT DOCUMENTS

| | | |
|---|---|---|
| 2002/0146511 A1 | 10/2002 | Chiang et al. |
| 2003/0091462 A1 | 5/2003 | Weiler et al. |
| 2004/0028837 A1 | 2/2004 | Fink |
| 2004/0140778 A1 | 7/2004 | Petrin et al. |
| 2004/0168771 A1 | 9/2004 | Mitrovic |
| 2004/0224504 A1* | 11/2004 | Gadgil ........................ 438/680 |
| 2005/0156530 A1 | 7/2005 | Lee et al. |
| 2005/0221002 A1 | 10/2005 | Nakamura et al. |
| 2005/0238890 A1 | 10/2005 | Kutoba |
| 2006/0063390 A1 | 3/2006 | Lu et al. |
| 2006/0118043 A1 | 6/2006 | Wagner et al. |
| 2006/0141290 A1 | 6/2006 | Sheel et al. |

OTHER PUBLICATIONS

Patrick R. McCurdy, "Pulsed and Continuous Wave Plasma Deposition of Amorphous, Hydrogenated Silicon Carbide from $SiH_4/CH_4$ Plasmas", Journal of Vacuum Science & Technology A: Vacuum, Surfaces, and Films, Sep. 1999, vol. 17, Issue 5, pp. 2475-2484.

Catherine B. Labelle, "Pulsed Plasma-enhanced Chemical Vapor Deposition from $CH_2F_2H_2F_4$, and $CHClF_2$", Journal of Vacuum Science & Technology A: Vacuum, Surfaces, and Films, Mar. 1999, vol. 17, Issue 2, pp. 445-452.

Seiji Samukawa, "Essential Points for Precise Etching Processes in pulse-time-modulated Ultrahigh-frequency Plasma", Journal of Vacuum Science & Technology A: Vacuum, Surfaces, and Films, May 1997, vol. 15, Issue 3, pp. 643-646.

J. Goforth, "Additional Studies of rf Plasmoids", Journal of Applied Physics, vol. 45, No. 3, Mar. 1974, pp. 1474-1475.

E. Aydil, "Multiple Steady States in a Radio Frequency Chlorine Glow Discharge", J. Appl. Phys. vol. 69, No. 1, Jan. 1, 1991, pp. 109-114.

C.W. Bruce, "Spatially Resolved Spectroscopic Profiles of Plasmoidal rf Discharges", J. Appl. Phys., vol. 43, No. 12, Dec. 1972, pp. 5112-5117.

M.D. Kregel, "Elementary Analysis of the Deleayed-Emission Theory of the Dark Sheath in rf Plasmoidal Discharges", J. Appl. Physics, vol. 41, No. 7, Jun. 1970, pp. 3041-3044.

Kenji Hiramatsu, "Formation of TiN Films with Low Cl Concentration by Pulsed Plasma Chemical Vapor Deposition", Journal of Vacuum Science & Technology A: Vacuum, Surfaces, and Films, May 1996, vol. 14, Issue 3, pp. 1037-1040.

S.-B. Cho, "Improved Etch Characteristics of $SiO_2$ by the Enhanced Inductively Coupled Plasma", Journal of Vacuum Science & Technology A: Vacuum, Surfaces, and Films, Jul. 2001, vol. 19, Issue 4, pp. 1308-1311.

L. Lamont, "Space Charge Instabilities of the rf Induced Gas Discharge of the Diode Configuration", The Journal of Vacuum Science and Technology, vol. 7, No. 1 pp. 155-158, ? 1969.

A. Miller, "Measurements of the Time-Averaged Potentials in Low-Pressure, rf Discharges Using an Ion-Beam Probe", Journal of Applied Physics, vol. 39, No. 1, Feb. 15, 1968, pp. 1853-1856.

J. Amorim, "High-Density Plasma Mode of an Inductively Coupled Radio Frequency Discharge", j. Vac. Sci. Technol. B vol. 9, No. 2 Mar./Apr. 1991, pp. 362-365.

D.A. Butter, "Creation Model of the Bostick Plasmoid in Magnetic-Field-Free Space", J. Appl. Phys., vol.

* cited by examiner

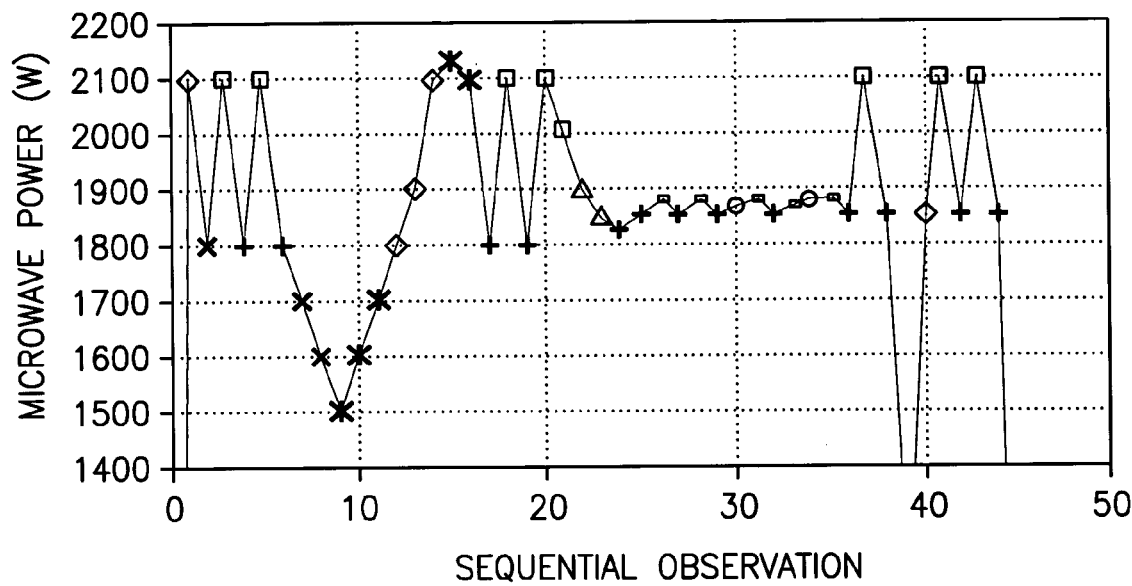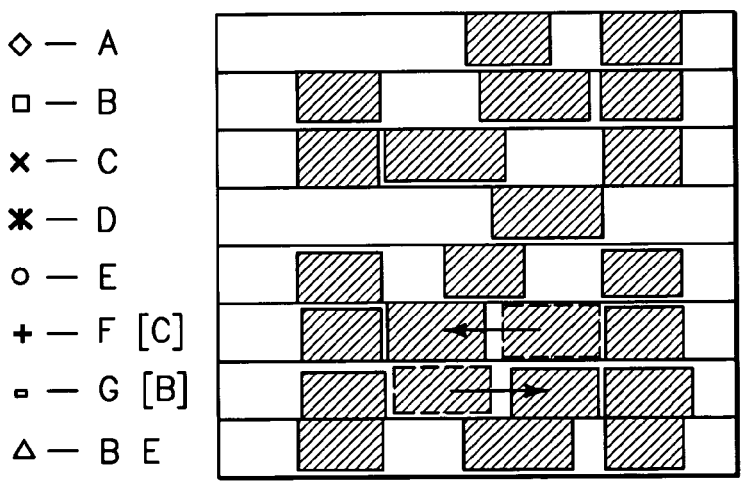

PLASMA PROCESSING, DEPOSITION, AND ALD METHODS

RELATED PATENT DATA

This patent resulted from a continuation application of U.S. patent application Ser. No. 10/930,895, filed Aug. 30, 2004 now U.S. Pat. No. 7,323,400, and which is incorporated herein by reference.

TECHNICAL FIELD

This invention pertains to plasma processing methods, deposition methods, and atomic layer deposition methods, including methods that involve generating a stable plasmoid.

BACKGROUND OF THE INVENTION

The use of plasma in deposition and etch processes constitutes a well known technology and uses a wide variety of process parameters to adapt to a variety of applications. "Plasmoids" constitute a long-observed phenomenon that can occur under certain plasma generation conditions. Plasmoids have been described as a plasma space charge instability that breaks up the preferred homogeneous discharge of a plasma into regions of varying plasma density. Plasmoids can have a variety of shapes, sizes, densities, and lifetimes. Even though the occurrence of plasmoids is known, they are not well studied and appear to offer little, if any, application to plasma deposition or etch processes or other types of plasma processing. It would be an advantage to further investigate possible plasma processing applications for plasmoids.

SUMMARY OF THE INVENTION

In one aspect of the invention, a plasma processing method includes providing a substrate in a processing chamber, the substrate having a surface, and generating a plasma in the processing chamber. The plasma provides at least two regions that exhibit different plasma densities. The method includes exposing at least some of the surface to both of the at least two regions. By way of example, exposing the surface to both of the at least two regions may include rotating the plasma and/or rotating the substrate. Accordingly, exposing can include cyclically exposing. Exposing to both of the at least two regions may modify a composition and/or structure of the surface.

In another aspect of the invention, a plasma processing method includes providing a bulk semiconductor wafer in a processing chamber, the wafer having a surface, and generating a stable plasmoid in the processing chamber. The plasmoid is characterized by a steady state plasma wave providing multiple plasma density lobes uniformly distributed about an axis of symmetry that is perpendicular to the surface and providing plasma between the lobes exhibiting lower plasma densities. The method includes rotating the lobes about the axis of symmetry and cyclically exposing at least some of the surface both to the density lobes and to the lower density plasma. By way of example, exposing both to the density lobes and to the lower density plasma may modify a composition and/or structure of the surface.

In a further aspect of the invention, a deposition method includes providing a substrate in a processing chamber, depositing a layer having a composition on the substrate and, after depositing the layer, generating a stable plasmoid in the processing chamber. The plasmoid is characterized by a controlled plasma instability providing at least two regions that exhibit different plasma densities. The method includes exposing at least some of the layer to both of the at least two regions and modifying the composition of the layer. By way of example, depositing the layer can include ALD. Modifying the composition of the layer can include removing a component of the layer and/or adding a different component to the layer.

In a still further aspect of the invention, an ALD method includes providing a substrate in a processing chamber, chemisorbing a monolayer of a first precursor on the substrate and, after chemisorbing the monolayer, generating a stable plasmoid in the processing chamber. The monolayer contains a ligand of the first precursor and the plasmoid is characterized by a controlled plasma instability providing at least two regions that exhibit different plasma densities. The method includes cyclically exposing at least some of the monolayer to both of the at least two regions and removing the ligand from the monolayer. By way of example, the ligand can include halogens and/or amines. The plasmoid may include a nitrogen source, such that the added component includes nitrogen and the exposed monolayer includes a metal nitride.

In another aspect of the invention, an ALD method includes providing a bulk semiconductor wafer in a processing chamber, chemisorbing a monolayer of a metal-containing precursor on the substrate and, after chemisorbing the monolayer, generating a stable plasmoid in the processing chamber. The monolayer contains a ligand of the precursor and the plasmoid is characterized by a steady state plasma wave providing multiple plasma density lobes uniformly distributed about an axis of symmetry that is perpendicular to the monolayer and providing plasma between the lobes exhibiting lower plasma densities. The method includes rotating the lobes about the axis of symmetry and cyclically exposing at least some of the monolayer both to the density lobes and to the lower density plasma. The cyclical exposing removes the ligand from the monolayer.

BRIEF DESCRIPTION OF THE DRAWINGS

Preferred embodiments of the invention are described below with reference to the following accompanying drawings.

FIG. 1 is a chart listing observed plasmoid states and identifying the occurrence of such states at varied microwave power settings.

DETAILED DESCRIPTION OF THE PREFERRED EMBODIMENTS

Through experimentation, plasma conditions have been identified that enable generation of plasmoids in a controlled manner. That is, plasmoids are generally considered to be a degraded form of plasma, given their instability, since homogenous plasmas are generally preferred to enable reproducible use of plasma in plasma processing methods. Understandably, some concern exists among those of ordinary skill that a plasma containing plasmoids would produce inconsistent deposition or etch results given the characteristic plasma instability. However, stable plasmoids have been identified that may be characterized by a controlled plasma instability providing at least two regions that exhibit different plasma densities. More specifically, selected plasma conditions may generate plasmoids characterized by a steady state plasma wave providing multiple plasma density lobes uniformly distributed about an axis of symmetry and providing plasma between the lobes exhibiting lower plasma densities. The lobes may be rotated about the axis of symmetry. Such stable plasmoids may be reproducibly generated and have been categorized, base upon their appearance through a plasma chamber view port window, as shown in FIG. 1.

In FIG. 1, the cross-hatched areas within the boxes showing a graphical depiction represent lobes of dense plasma while the open areas represent areas of lower density plasma observed within the view port window identified by the rectangular box around the lobe patterns. The specific shape of the lobes is not known. However, while lobe shapes may be worth identifying by future experimentation, a more significant feature of the identified stable plasmoids is the density differences that may be relied upon for advantageous plasma processing as described herein.

Understandably, the categorization of plasmoid types listed in FIG. 1 is somewhat limited in that it does not provide a full three-dimensional description of the plasmoids. Table 1 lists further details of the plasmoids. Acquiring the FIG. 1 and Table 1 data included placing a silicon wafer in a Tokyo Electron Ltd. (of Tokyo, Japan) SPA414 chamber at the normal processing position. The SPA414 is a single wafer, slot plane antenna, plasma processing system. Process gases were introduced as follows: helium at 200 standard cubic centimeters per minute (sccm), hydrogen ($H_2$) at 4000 sccm, ammonia at ($NH_3$) 1800 sccm, and argon at 50 sccm. Chamber pressure was regulated at 5.3 Torr using a throttle valve in communication with a capacitive manometer in a feedback circuit. Starting at 0 W, microwave power was increased to 2100 W for the first observation and varied between 1500 W and 2150 W as shown in FIG. 1, except that observation number 39 and 45 occurred at 0 W where no plasmoid was observed.

TABLE 1

| Plasmoid Type | Description |
| --- | --- |
| A | double lobed, stable |
| B | triple lobed, stable, observed for higher powers |
| C | triple lobed, stable, observed for lower powers |
| D | single lobed, stable |
| E | triple lobed, stable, evenly spaced |
| F [C] | triple lobed, evolving from B to C type, occurs when transitioning from higher power to lower power |
| G [B] | triple lobed, evolves from C to B type, occurs when transitioning from lower power to higher power |
| B E | triple lobed, stable, appears as an intermediate state between B and E type |

As can be seen from FIG. 1 and Table 1, plasmoid types generally depend upon the microwave power applied. From a triple-lobed plasmoid, the center lobe shifts position and can combine with the right lobe when forming double lobed plasmoids. Also, the left lobe can move toward the right lobe when forming single lobed plasmoids. The divergence and convergence of all lobes can be observed during power manipulation. The single-lobed plasmoid can appear on the right side of the view port and then split into multiple lobes as microwave power is manipulated. Observation has identified a hysteresis effect in the behavior of plasmoids that correlates with the microwave power setting prior to establishing a desired plasmoid. The hysteresis effect is apparent from FIG. 1.

Also, triple-lobed plasmoid state changes appear to have a cross over power zone between 1800 Watts (W) and 1900 W that is demonstrated in the FIG. 1 data to occur somewhere between 1825 W and 1850 W. Depending upon the direction of power changes (increasing power or decreasing power), a given plasma power setting within the crossover region may establish different plasmoid types. However, the identified plasmoid types are nevertheless reproducible and the hysteresis effect and/or crossover region does not preclude providing a particular desired plasmoid type among those listed. It is expected that further experimentation may assist to expand the knowledge about plasmoid behavior and allow fine tuning of plasmoid types to more specific power ranges and power manipulations. The further experimentation may simplify and make more accurate the generation of desired plasmoid states.

Possible applications for the plasmoids observed include deposition (such as atomic layer deposition (ALD)) and etching (including micromachining and nanostructure creation), among potentially other plasma processes. A conventional problem associated with generating plasmoids includes their inherent instability. However, by generating plasmoids as a controlled plasma instability, their distribution of varying plasma densities can be advantageously used. A variety of conventional plasma processes exist that vary exposure to plasma density. Often referred to as "pulsed plasma" deposition, the cyclic increasing and decreasing of plasma power is used in such methods to vary the density of homogeneous plasma to which a substrate is exposed. Some of the advantages of pulsed plasma include the ability to expose surfaces to variable ionic species/neutral reactive species ratios during processing. Pulsed processing has been shown to change deposited film stoichiometry and bonding structure.

Exposing a substrate in accordance with the aspects of the invention to a stable plasmoid providing at least two regions that exhibit different plasma densities is similar to pulsed plasma processing in that a given region of a substrate may be exposed to varied plasma densities. However, the aspects of the invention differ in that plasma power is maintained constant during exposure of the substrate rather than cyclically varied. It should be appreciated that holding a set of process parameters constant constitutes a more reliable and reproducible type of plasma processing in comparison to cyclically varying a parameter, such as plasma power. Thus, the advantage of the aspects of the invention described herein will be readily appreciated. Clearly, a process relying upon a plasmoid having the properties described herein can exhibit a level of reproducibility that exceeds the reproducibility of a similar method that instead exposes a substrate to the same varied plasma densities by cycling plasma power.

One of the possible purposes for using plasma in plasma processing involves activation of surfaces with energetic ion bombardment from the plasma at energies below the threshold energies for initiating sputtering or reactive sputtering. The aspects of the inventions herein can enhance the activation effects in processes relying upon such ion-surface interaction techniques. One of several possible examples includes energizing a chemisorbed ALD monolayer that contains a precursor with ligands to be removed from the monolayer. A variety of possible mechanisms exist for ligand removal and for deposition of additional materials or monolayers. However, observation has indicated that plasmoid exposure can enhance ligand removal and improve ALD yield measured in Angstroms per cycle. More specific details are provided below.

ALD involves formation of successive atomic layers on a substrate. Such layers may comprise an epitaxial, polycrystalline, amorphous, etc. material. ALD may also be referred to as atomic layer epitaxy, atomic layer processing, etc. Further, the invention may encompass other deposition methods not traditionally referred to as ALD, for example, chemical vapor deposition (CVD), pulsed CVD, etc., but nevertheless including the method steps described herein. The deposition methods herein may be described in the context of formation on a semiconductor wafer. However, the invention encompasses deposition on a variety of substrates besides semiconductor substrates.

Described in summary, ALD includes exposing an initial substrate to a first chemical precursor to accomplish chemisorption of the precursor onto the substrate. Theoretically, the chemisorption forms a monolayer that is uniformly one atom or molecule thick on the entire exposed initial substrate. In other words, a saturated monolayer. Practically, as further described below, chemisorption might not occur on all portions of the substrate. Nevertheless, such an imperfect monolayer is still a monolayer in the context of this document. In many applications, merely a substantially saturated monolayer may be suitable. A substantially saturated monolayer is one that will still yield a deposited layer exhibiting the quality and/or properties desired for such layer.

The first precursor is purged from over the substrate and a second chemical precursor is provided to react with the first monolayer of the first precursor. The second precursor is then purged and the steps are repeated with exposure of the deposited monolayer to the first precursor. In some cases, the two monolayers may be of the same precursor. As an option, the second precursor can react with the first precursor, but not chemisorb additional material thereto. As but one example, the second precursor can remove some portion of the chemisorbed first precursor, altering such monolayer without forming another monolayer thereon. Also, a third precursor or more may be successively chemisorbed (or reacted) and purged just as described for the first and second precursors.

In the context of the present document, "reacting" or "reaction" refers to a change or transformation in which a substance decomposes, combines with other substances, or interchanges constituents with other substances. Thus, it will be appreciated that "chemisorbing" or "chemisorption" is a specific type of reacting or reaction that refers to taking up and chemically binding (a substance) onto the surface of another substance.

Purging may involve a variety of techniques including, but not limited to, contacting the substrate and/or monolayer with a carrier gas and/or lowering pressure to below the deposition pressure to reduce the concentration of a precursor contacting the substrate and/or chemisorbed precursor. Examples of carrier gases include $N_2$, Ar, He, etc. Purging may instead include contacting the substrate and/or monolayer with any substance that allows chemisorption byproducts to desorb and reduces the concentration of a contacting precursor preparatory to introducing another precursor. The contacting precursor may be reduced to some suitable concentration or partial pressure known to those skilled in the art as suitable based upon the specifications for the product of a particular deposition process.

ALD is often described as a self-limiting process, in that a finite number of sites exist on a substrate to which the first precursor may form chemical bonds. The second precursor might only bond to the first precursor and thus may also be self-limiting. Once all of the finite number of sites on a substrate is bonded with a first precursor, the first precursor will often not bond to other of the first precursor already bonded with the substrate. However, process conditions can be varied in ALD to promote such bonding and render ALD not self-limiting. Accordingly, ALD may also encompass a precursor forming other than one monolayer at a time by stacking of a precursor, forming a layer more than one atom or molecule thick. The various aspects of the present invention described herein are applicable to any circumstance where ALD may be desired. A few examples of materials that may be deposited by ALD include metals, metal oxides, metal nitrides, and others.

Typically, traditional ALD occurs within an often-used range of temperature and pressure and according to established purging criteria to achieve the desired formation of an overall ALD layer one monolayer at a time. Even so, ALD conditions can vary greatly depending on the particular precursors, layer composition, deposition equipment, and other factors according to criteria known by those skilled in the art. Maintaining the traditional conditions of temperature, pressure, and purging minimizes unwanted reactions that may impact monolayer formation and quality of the resulting overall ALD layer. Accordingly, operating outside the traditional temperature and pressure ranges may risk formation of defective monolayers.

The general technology of chemical vapor deposition (CVD) includes a variety of more specific processes, including, but not limited to, plasma enhanced CVD and others. CVD is commonly used to form non-selectively a complete, deposited material on a substrate. One characteristic of CVD is the simultaneous presence of multiple precursors in the deposition chamber that react to form the deposited material. Such condition is contrasted with the purging criteria for traditional ALD wherein a substrate is contacted with a single deposition precursor that chemisorbs to a substrate or reacts with a previously deposited precursor. An ALD process regime may provide a simultaneously contacted plurality of precursors of a type or under conditions such that ALD chemisorption, rather than CVD reaction occurs. Instead of reacting together, the plurality of precursors may chemisorb to a substrate or previously deposited precursor, providing a surface onto which subsequent precursors may next chemisorb or react to form a complete layer of desired material.

Under most CVD conditions, deposition occurs largely independent of the composition or surface properties of an underlying substrate. By contrast, chemisorption rate in ALD might be influenced by the composition, crystalline structure, and other properties of a substrate or chemisorbed precursor. Other process conditions, for example, pressure and temperature may also influence chemisorption rate. In comparison to the predominantly thermally driven CVD, ALD is predominantly chemically driven. Accordingly, ALD is often conducted at much lower temperatures than CVD.

In one aspect of the invention, a plasma processing method includes providing a substrate in a processing chamber, the substrate having a surface, and generating a plasma in the processing chamber. The plasma provides at least two regions that exhibit different plasma densities. The method includes exposing at least some of the surface to both of the at least two regions.

By way of example, the substrate may include a bulk semiconductor wafer. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Generating the plasma can include applying microwave power. Even so, those of ordinary skill will appreciate that RF power and various plasma generating devices might also be conducive to generating plasmoids. Specifically, the plasma can include a stable plasmoid characterized by a controlled plasma instability. Preferably, the plasma includes a stable plasmoid characterized by a steady state plasma wave providing multiple plasma density lobes uniformly distributed about an axis of symmetry that is perpendicular to the substrate surface and providing plasma between the lobes exhibiting lower plasma densities.

Exposing the surface to both of the at least two regions may include rotating the plasma. Rotation of the plasma may be accomplished by variations (slight perturbations) in process parameters. Merely by slightly changing applied microwave power in the case of the TEL SPA414 deposition tool example, the plasmoid was changed from rotating clockwise (at 2093 W) to not rotating (at 2094 W) to rotating counterclockwise (at 2095 W). The farther away from the stable point (in this example, 2094 W) that microwave power is set, the faster the rotation. For a 1 W difference, the rotation was very slow. It is conceivable that gas flow or pressure variations might also produce rotation changes. Instead of or in addition to rotating the plasma, exposing the surface to both of the at least two regions may include rotating the substrate. Accordingly, aspects of the invention may be practiced even with a stationary plasmoid.

An advantage may exist for processing that alternates exposure of at least some of the surface between the two regions of different plasma densities. Accordingly, exposing can include cyclically exposing at least some of the surface to both of the at least two regions. An appropriate number of cycles to accomplish a desired effect can be selected by those of ordinary skill after trial runs or by reference to a number of similar cycles used in pulsed plasma processing. Exposing to both of the at least two regions may modify a composition and/or structure of the surface.

In another aspect of the invention, a plasma processing method includes providing a bulk semiconductor wafer in a processing chamber, the wafer having a surface, and generating a stable plasmoid in the processing chamber. The plasmoid is characterized by a steady state plasma wave providing multiple plasma density lobes uniformly distributed about an axis of symmetry that is perpendicular to the surface and providing plasma between the lobes exhibiting lower plasma densities. The method includes rotating the lobes about the axis of symmetry and cyclically exposing at least some of the surface both to the density lobes and to the lower density plasma. By way of example, exposing both to the density lobes and to the lower density plasma may modify a composition and/or structure of the surface.

In a further aspect of the invention, a deposition method includes providing a substrate in a processing chamber, depositing a layer having a composition on the substrate and, after depositing the layer, generating a stable plasmoid in the processing chamber. The plasmoid is characterized by a controlled plasma instability providing at least two regions that exhibit different plasma densities. The method includes exposing at least some of the layer to both of the at least two regions and modifying the composition of the layer. By way of example, depositing the layer can include ALD. Exposing to both of the at least two regions can include rotating the plasma and/or rotating the substrate. The exposing can be cyclical. Modifying the composition of the layer can include removing a component of the layer and/or adding a different component to the layer.

In a still further aspect of the invention, an ALD method includes providing a substrate in a processing chamber, chemisorbing a monolayer of a first precursor on the substrate and, after chemisorbing the monolayer, generating a stable plasmoid in the processing chamber. The monolayer contains a ligand of the first precursor and the plasmoid is characterized by a controlled plasma instability providing at least two regions that exhibit different plasma densities. The method includes cyclically exposing at least some of the monolayer to both of the at least two regions and removing the ligand from the monolayer. By way of example, the ligand can include halogens and/or amines. Exposing to both of the at least two regions may also add a component to the monolayer. For example, the plasmoid may include a nitrogen source, such that the added component includes nitrogen and the exposed monolayer includes a metal nitride.

In another aspect of the invention, an ALD method includes providing a bulk semiconductor wafer in a processing chamber, chemisorbing a monolayer of a metal-containing precursor on the substrate and, after chemisorbing the monolayer, generating a stable plasmoid in the processing chamber. The monolayer contains a ligand of the precursor and the plasmoid is characterized by a steady state plasma wave providing multiple plasma density lobes uniformly distributed about an axis of symmetry that is perpendicular to the monolayer and providing plasma between the lobes exhibiting lower plasma densities. The method includes rotating the lobes about the axis of symmetry and cyclically exposing at least some of the monolayer both to the density lobes and to the lower density plasma. The cyclical exposing removes the ligand from the monolayer. By way of example, the ligand can include halogens and/or amines. The cyclical exposing may also add a component to the monolayer. The plasmoid can include a nitrogen source, the added component can include nitrogen, and the exposed monolayer can include a metal nitride.

EXAMPLE 1

A bulk silicon wafer was placed in the processing chamber of a TEL SPA414 deposition tool and exposed to a flow of 5 sccm $TiCl_4$ and 1000 sccm argon for 25 seconds to allow chemisorption of $TiCl_4$ on the wafer. Following the 25 second pulse of the $TiCl_4$ precursor, the deposition chamber was purged with helium at a flow rate of about 1800 sccm. Substrate temperature during chemisorption was 350° C., but may be varied from about 350 to about 650° C. Pressure during chemisorption was 10 Torr but can be varied from about 10 milliTorr to about 100 Torr. Following purge of the chamber, $NH_3$ was introduced at a flow rate of 1800 sccm along with 50 sccm Ar, 2000 sccm $H_2$, and 1800 sccm He while generating a plasmoid. A 2 second pump down of the chamber followed plasmoid exposure and then it was purged with 450 sccm Ar, 4000 sccm $H_2$, and 1800 sccm He.

The plasmoid was generated by increasing microwave power to 2100 W to provide a multiple-lobed plasmoid. The plasma was rotated about its axis of symmetry to cyclically expose at least some of the $TiCl_4$ monolayer both to the density lobes and to the lower density plasma of the plasmoid. Exposure to the $NH_3$ plasmoid nitrided the deposited Ti monolayer and was believed to remove the chlorine ligand by interaction with hydrogen of the ionized $NH_3$ in the plasmoid. The cycle of chemisorption, purging, plasmoid exposure, and purging was repeated 40 times to form a TiN layer having a thickness of 70 Angstroms. Accordingly, the yield of the ALD method using plasmoid exposure was approximately 2 Angstroms per cycle. Analysis revealed a chlorine content below the detection limit of 1 atomic percent.

Example 1 may be modified to deposit Ti metal layers merely by substituting $NH_3$ with $H_2$. However, such Ti films may be unstable and oxidize upon atmospheric exposure unless protected by a TiN or other surface layer.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A plasma processing method comprising:
   providing a substrate in a processing chamber, the substrate having a surface;
   generating a stable plasmoid in the processing chamber, the plasmoid being characterized by a controlled plasma instability providing at least two regions that exhibit different plasma densities and the instability being controlled at least by an applied microwave power; and
   exposing at least some of the surface to both of the at least two regions.

2. The method of claim 1 wherein the substrate comprises a bulk semiconductor wafer.

3. The method of claim 1 wherein the controlled plasma instability provides a steady state plasma wave providing multiple plasma density lobes uniformly distributed about an axis of symmetry that is perpendicular to the surface and providing plasma between the lobes exhibiting lower plasma densities.

4. The method of claim 1 wherein exposing to both of the at least two regions comprises rotating the plasma.

5. The method of claim 1 wherein exposing to both of the at least two regions comprises rotating the substrate.

6. The method of claim 1 comprising cyclically exposing at least some of the surface to both of the at least two regions.

7. The method of claim 1 wherein exposing to both of the at least two regions modifies a composition and/or structure of the surface.

8. The method of claim 1 wherein the plasma processing method is comprised by a deposition method.

9. The method of claim 1 wherein the plasma processing method is comprised by an etch method.

10. A plasma processing method comprising:
    providing a bulk semiconductor wafer in a processing chamber, the wafer having a surface;
    generating a stable plasmoid in the processing chamber, the plasmoid being characterized by a steady state plasma wave providing multiple plasma density lobes uniformly distributed about an axis of symmetry that is perpendicular to the surface and providing plasma between the lobes exhibiting lower plasma densities;
    rotating the lobes about the axis of symmetry and cyclically exposing at least some of the surface to both the density lobes and the lower density plasma.

11. The method of claim 10 wherein generating the plasmoid comprises applying microwave power.

12. The method of claim 10 wherein exposing to both the density lobes and the lower density plasma modifies a composition and/or structure of the surface.

13. The method of claim 10 wherein the plasma processing method is comprised by a deposition method.

14. The method of claim 10 wherein the plasma processing method is comprised by an etch method.

15. A plasma processing method comprising:
    providing a substrate in a processing chamber, the substrate having a surface;
    generating a plasma in the processing chamber, the plasma providing at least two regions that exhibit different plasma densities in that the plasma includes a stable plasmoid characterized by a steady state plasma wave providing multiple plasma density lobes uniformly distributed about an axis of symmetry that is perpendicular to the surface and providing plasma between the lobes exhibiting lower plasma densities;
    exposing at least some of the surface to both of the at least two regions.

16. The method of claim 15 wherein exposing to both of the at least two regions comprises rotating the plasma.

17. The method of claim 15 wherein exposing to both of the at least two regions comprises rotating the substrate.

18. The method of claim 15 comprising cyclically exposing at least some of the surface to both of the at least two regions.

19. The method of claim 15 wherein generating the plasmoid comprises applying microwave power.

* * * * *